United States Patent
Francis

(10) Patent No.: US 11,282,631 B2
(45) Date of Patent: Mar. 22, 2022

(54) EMBEDDED MAGNETIC COMPONENT DEVICE

(71) Applicant: Murata Manufacturing Co., Ltd., Nagaokakyo (JP)

(72) Inventor: Lee Francis, Milton Keynes (GB)

(73) Assignee: MURATA MANUFACTURING CO., LTD., Kyoto (JP)

(*) Notice: Subject to any disclaimer, the term of this patent is extended or adjusted under 35 U.S.C. 154(b) by 252 days.

(21) Appl. No.: 16/502,968

(22) Filed: Jul. 3, 2019

(65) Prior Publication Data

US 2019/0326048 A1    Oct. 24, 2019

Related U.S. Application Data

(60) Continuation of application No. 15/854,836, filed on Dec. 27, 2017, now Pat. No. 10,347,413, which is a
(Continued)

(30) Foreign Application Priority Data

Oct. 17, 2014    (GB) ...................................... 1418482

(51) Int. Cl.
*B23P 19/00* (2006.01)
*H01F 27/28* (2006.01)
(Continued)

(52) U.S. Cl.
CPC ......... *H01F 27/2804* (2013.01); *H01F 27/24* (2013.01); *H01F 27/2895* (2013.01);
(Continued)

(58) Field of Classification Search
CPC ............ H01F 27/2804; H01F 27/2895; H01F 41/046; H05K 1/0298; H05K 1/165; H05K 3/4697
See application file for complete search history.

(56) References Cited

U.S. PATENT DOCUMENTS 7,477,128 B2 * 1/2009 Quilici ................ H01F 17/0033
336/200
8,466,769 B2 * 6/2013 Dalmia ............... H01F 17/0006
336/200
(Continued)

OTHER PUBLICATIONS

Francis, "Method of Manufacturing an Embedded Magnetic Component Device", U.S. Appl. No. 15/854,836, filed Dec. 27, 2017.

*Primary Examiner* — Paul D Kim
(74) *Attorney, Agent, or Firm* — Keating & Bennett, LLP

(57) ABSTRACT

A magnetic core is situated in a cavity routed into an insulating substrate. The cavity and magnetic core are coved with a first insulating layer. Through holes are then formed through the first insulating layer and the insulating substrate, and plated to form conductive vias. Metallic traces are added to the exterior surfaces of the first insulating layer and the insulating substrate to form upper and lower winding layers. The metallic traces and conductive vias define the respective primary and secondary side windings for an embedded transformer. At least a second set of the outer conductive vias, are spaced farther from the cavity than a first set, and have greater via hole diameter than the vias in the first set. This reduces the resistance of the windings for a given substrate size and improves the performance of the device.

10 Claims, 12 Drawing Sheets

Related U.S. Application Data division of application No. 14/883,854, filed on Oct. 15, 2015, now Pat. No. 9,887,034.

(51) Int. Cl.
  *H01F 41/04* (2006.01)
  *H05K 1/02* (2006.01)
  *H05K 1/16* (2006.01)
  *H01F 27/24* (2006.01)
  *H05K 3/46* (2006.01)

(52) U.S. Cl.
  CPC ......... *H01F 41/046* (2013.01); *H05K 1/0298* (2013.01); *H05K 1/165* (2013.01); *H01F 2027/2809* (2013.01); *H05K 3/4697* (2013.01); *H05K 2201/086* (2013.01)

(56) References Cited

U.S. PATENT DOCUMENTS

| | | | | |
|---|---|---|---|---|
| 8,860,543 | B2* | 10/2014 | Schaffer | H01F 27/2895 336/200 |
| 9,113,570 | B2* | 8/2015 | Li | H05K 1/165 |
| 9,847,166 | B2* | 12/2017 | Kneller | H01F 27/288 |
| 10,002,703 | B2* | 6/2018 | Wang | H01F 27/2895 |
| 10,049,803 | B2* | 8/2018 | Quilici | H01F 41/042 |
| 10,176,917 | B2* | 1/2019 | Parish | H01F 27/2804 |
| 2006/0176139 | A1* | 8/2006 | Pleskach | H01F 17/0033 336/223 |
| 2010/0295646 | A1* | 11/2010 | Harrison | H01F 41/046 336/192 |
| 2011/0108317 | A1* | 5/2011 | Harrison | H01F 17/0033 174/266 |
| 2014/0043130 | A1* | 2/2014 | Dalmia | H01F 27/2804 336/200 |

* cited by examiner

EMBEDDED MAGNETIC COMPONENT DEVICE

CROSS-REFERENCE TO RELATED APPLICATIONS

This is a division of U.S. application Ser. No. 14/883,854 filed on Oct. 15, 2015, and a continuation of U.S. application Ser. No. 15/854,836 filed on Dec. 27, 2017.

BACKGROUND OF THE INVENTION

1. Field of the Invention

The present invention relates to embedded magnetic component devices, and in particular to embedded magnetic component devices with improved isolation performance.

2. Description of the Related Art

Power supply devices, such as transformers and converters, involve magnetic components such as transformer windings and often magnetic cores. The magnetic components typically contribute the most to the weight and size of the device, making miniaturization and cost reduction difficult.

In addressing this problem, it is known to provide low-profile transformers and inductors in which the magnetic components are embedded in a cavity in a resin substrate, and the necessary input and output electrical connections for the transformer or inductor are formed on the substrate surface. A printed circuit board (PCB) for a power supply device can then be formed by adding layers of solder resist and copper plating to the top and/or bottom surfaces of the substrate. The necessary electronic components for the device may then be surface mounted on the PCB. This allows a significantly more compact and thinner device to be built.

In US2011/0108317, for example, a packaged structure having a magnetic component that can be integrated into a printed circuit board, and a method for producing the packaged structure, are described. In a first method, illustrated in FIGS. 1A to 1E, an insulating substrate 101, made of epoxy based glass fiber, has a cavity 102 (FIG. 1A). An elongate toroidal magnetic core 103 is inserted into the cavity 102 (FIG. 1B), and the cavity is filled with an epoxy gel 104 (FIG. 1C) so that the magnetic component 103 is fully covered. The epoxy gel 104 is then cured, forming a solid substrate 105 having an embedded magnetic core 103.

Through-holes 106 for forming primary and secondary side transformer windings are then drilled in the solid substrate 105 on the inside and outside circumferences of the toroidal magnetic component 103 (FIG. 1D). The through-holes 106 are then plated with copper, to form vias 107, and metallic traces 108 are formed on the top and bottom surfaces of the solid substrate 105 to connect respective vias 107 together into a winding configuration (FIG. 1E) and to form input and output terminals 109. In this way, a coil conductor is created around the magnetic component. The coil conductor shown in FIG. 1E is for an embedded transformer and has left and right coils forming primary and secondary side windings. Embedded inductors can be formed in the same way, but may vary in terms of the input and output connections, the spacing of the vias, and the type of magnetic core used.

A solder resist layer can then be added to the top and bottom surfaces of the substrate covering the metallic surface terminal lines, allowing further electronic components to be mounted on the solder resist layer. In the case of power supply converter devices, for example, one or more transistor switching devices and associated control electronics, such as Integrated Circuit (ICs) and passive components, may be mounted on the surface resist layer.

Devices manufactured in this way have a number of associated problems. In particular, air bubbles may form in the epoxy gel 104 as it is solidifying. During reflow soldering of the electronic components on the surface of the substrate, these air bubbles can expand and cause failure in the device.

US2011/0108317 also describes a second technique in which epoxy gel is not used to fill the cavity. This second technique will be described with respect to FIGS. 2A to 2E.

As illustrated in FIG. 2A, through-holes 202 are first drilled into a solid resin substrate 201 at locations corresponding to the interior and exterior circumference of an elongate toroidal magnetic core. The though-holes 202 are then plated to form the vertical conductive vias 203 of the transformer windings, and metallic caps 204 are formed on the top and the bottom of the conductive vias 203 as shown in FIG. 2B. A toroidal cavity 205 for the magnetic core is then routed in the solid resin substrate 201 between the conductive vias 203 (FIG. 2C), and a ring-type magnetic core 206 is placed in the cavity 205 (FIG. 2D). The cavity 205 is slightly larger than the magnetic core 206, and an air gap may therefore exist around the magnetic core 206.

Once the magnetic core 206 has been inserted into the cavity 205 an upper epoxy dielectric layer 207 (such as an adhesive bondply layer) is added to the top of the structure, to cover the cavity 205 and the magnetic core 206. A corresponding layer 207 is also added to the bottom of the structure (FIG. 2E) on the base of the substrate 201. Further through-holes are drilled through the upper and lower epoxy layers 207 to the caps 204 of the conductive vias 203, and plated, and metallic traces 208 are subsequently formed on the top and bottom surfaces of the device as before (FIG. 2F), to form input and output terminals 209.

As noted above, where the embedded magnetic components of FIGS. 1 and 2 are transformers, a first set of windings 110, 210 provided on one side of the toroidal magnetic core form the primary transformer coil, and a second set of windings 112, 212 on the opposite side of the magnetic core form the secondary windings. Transformers of this kind can be used in power supply devices, such as isolated DC-DC converters, in which isolation between the primary and secondary side windings is required. In the example devices illustrated in FIGS. 1 and 2, the isolation is a measure of the minimum spacing between the primary and secondary windings.

In the case of FIGS. 1 and 2 above, the spacing between the primary and secondary side windings must be large to achieve a high isolation value, because the isolation is only limited by the dielectric strength of the air, in this case in the cavity or at the top and bottom surfaces of the device. The isolation value may also be adversely affected by contamination of the cavity or the surface with dirt.

For many products, safety agency approval is required to certify the isolation characteristics. If the required isolation distance through air is large, there will be a negative impact on product size. For mains reinforced voltages (250 Vrms), for example, a spacing of approximately 5 mm is required across a PCB from the primary windings to the secondary windings in order to meet the insulation requirements of EN/UL60950.

The size and spacing of the vias forming the primary and second windings of the transformer is therefore largely decided by the specifications for the device. Vias have to have a sufficient diameter so that the vias can be successfully plated with metal and so that the metallic traces can be formed in an appropriate winding pattern to connect the vias together. Furthermore, if vias are placed too closely together or too close to other components, such as the magnetic core, the capacitance and isolation characteristics of the device can be adversely affected.

It would be desirable to provide an embedded magnetic component device with improved isolation characteristics, and to provide a method for manufacturing such a device.

SUMMARY OF THE INVENTION

According to a preferred embodiment of the present invention, an embedded magnetic component device includes an insulating substrate including a first side and a second side opposite the first side, and including a cavity therein, the toroidal cavity including an inner and an outer periphery; a magnetic core housed in the cavity; an electrical winding, extending through the insulating substrate and around the magnetic core; the electrical winding including: upper conductive traces located on the first side of the insulating substrate; lower conductive traces located on the second side of the insulating substrate; inner conductive connectors extending through the insulating substrate adjacent the inner periphery of the magnetic core, the inner conductive connectors respectively defining electrical connections between respective upper conductive traces and respective lower conductive traces; and outer conductive connectors extending through the insulating substrate adjacent the outer periphery of the magnetic core, the outer conductive connectors respectively defining electrical connections between respective first upper conductive traces and respective first lower conductive traces; wherein the outer conductive connectors include a first set of outer conductive connectors and a second set of outer conductive connectors; the first set of outer conductive connectors are located along the outer periphery of the cavity and are spaced from the outer periphery of the cavity by a first distance; and the second set of the outer conductive connectors are located at a greater distance from the outer periphery of the cavity than the first set; each of the first and second set of outer conductive connectors is electrically connected to an inner conductive connector through one of the upper conductive traces or one of the lower conductive traces.

The first side and the second side of the insulating substrate may be quadrilateral planar in shape, and the second set of outer conductive connectors may be located in a corner of the quadrilateral planar shape.

There may be a region of the device where the connectors in the second set of outer conductive connectors are continuously provided.

The inner conductive connectors may include a plurality of sets of inner conductive connectors, each set located along the inner periphery of the cavity and spaced from the inner periphery of the cavity by a different distance to the other sets.

The outer conductive connectors in the second set of outer conductive connectors may have a greater cross-sectional area than the outer conductive connectors in the first set of outer conductive connectors.

Electronic components may be mounted on the first side and/or the second side of the insulating substrate.

The magnetic core may include a first section and a second section, and the electrical winding may include a primary electrical winding disposed around the first section and a secondary electrical winding disposed around the second section, wherein the primary electrical winding and the secondary electrical winding are isolated from one another, and the primary electrical winding and the secondary electrical winding respectively include the upper conductive traces, the lower conductive traces, the inner conductive connectors, and the outer conductive connectors.

The device may further include: a first isolation barrier located on the first side of the insulating substrate, covering at least the portion of the first side between the primary electrical winding and the second electrical winding where the primary electrical winding and the second electrical winding are closest, and defining a solid bonded joint with the first side of the insulating substrate; and a second isolation barrier located on the second side of the insulating substrate, covering at least a portion of the second side between the primary electrical winding and the second electrical winding, where the primary electrical winding and the second electrical winding are closest, and defining a solid bonded joint with the second side of the insulating substrate.

The first isolation barrier and/or the second isolation barrier may include only a single layer. Alternatively, the first isolation barrier and/or the second isolation barrier may include a plurality of layers.

Electronic components may be mounted on the first isolation barrier and/or the second isolation barrier.

The magnetic core may be an elongated toroid a circular toroid, a gapped circular or elongate toroid, or has an EE, EI, I, EFD, EP, UI or UR toroidal core shape.

The inner conductive connectors and the outer conductive connectors may be conductive wires, pins or filaments extending through the insulating substrate.

A preferred embodiment of the present invention provides a method of manufacturing the above device. The method for manufacturing an embedded magnetic component device, includes a) preparing an insulating substrate including a first side and a second side opposite the first side, and including a toroidal cavity therein, the toroidal cavity including an inner and an outer periphery; b) installing a magnetic core in the toroidal cavity; c) forming an electrical winding extending through the insulating substrate and around the magnetic core, the electrical winding including: upper conductive traces located on the first side of the insulating substrate; lower conductive traces located on the second side of the insulating substrate; inner conductive connectors extending through the insulating substrate adjacent the inner periphery of the magnetic core, the inner conductive connectors respectively defining electrical connections between respective upper conductive traces and respective lower conductive traces; and outer conductive connectors extending through the insulating substrate adjacent the outer periphery of the magnetic core, the outer conductive connectors respectively defining electrical connections between respective first upper conductive traces and respective first lower conductive traces; d) in step c) forming the outer conductive connectors to include a first set of outer conductive connectors and a second set of outer conductive connectors; wherein the first set of outer conductive connectors are located along the outer periphery of the toroidal cavity and are spaced from the outer periphery of the toroidal cavity by a first distance; and the second set of the outer conductive connectors are located at a greater distance from the outer periphery of the toroidal cavity than the first set; and each one of the first and second set of outer conductive connectors is electrically connected to one of the inner conductive connectors through one of the upper conductive traces or one of the lower conductive traces.

The first side and the second side of the insulating substrate may be quadrilateral planar in shape, and the second set of outer conductive connectors may be located in a corner of the quadrilateral planar shape.

The second set of outer conductive connectors may be formed continuously in a region.

The inner conductive connectors may include a plurality of sets of inner conductive connectors, each set located along the inner periphery of the toroidal cavity and spaced from the inner periphery of the toroidal cavity by a different distance to the other sets.

The outer conductive connectors in the second set of outer conductive connectors may have a greater cross-sectional area than outer conductive connectors in the first set of outer conductive connectors.

The method may include mounting electronic components on the first side and/or the second side of the insulating substrate.

The magnetic core may include a first section and a second section, and the electrical winding may include a primary electrical winding disposed around the first section and a secondary electrical winding disposed around the second section, wherein the primary electrical winding and the secondary electrical winding are isolated from one another, and the primary electrical winding and the secondary electrical winding respectively include the upper conductive traces, the lower conductive traces, the inner conductive connectors, and the outer conductive connectors.

The method may also include: forming a first isolation barrier on the first side of the insulating substrate, covering at least the portion of the first side between the primary electrical winding and the second electrical winding where the primary electrical winding and the second electrical winding are closest, the first insulation barrier defining a solid bonded joint with the first side of the insulating substrate; forming a second isolation barrier on the second side of the insulating substrate, covering at least a portion of the second side between the primary electrical winding and the second electrical winding, where the primary electrical winding and the second electrical winding are closest, the second isolation barrier defining a solid bonded joint with the second side of the insulating substrate.

A preferred embodiment of the present invention provides a power electronics device including the embedded magnetic component device.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

First Preferred Embodiment

A first preferred embodiment of the present invention of an embedded magnetic component device will now be described with reference to FIGS. 3A to 3F. A completed embedded magnetic component device according to the first preferred embodiment is illustrated in FIG. 3F.

Figure 1A:
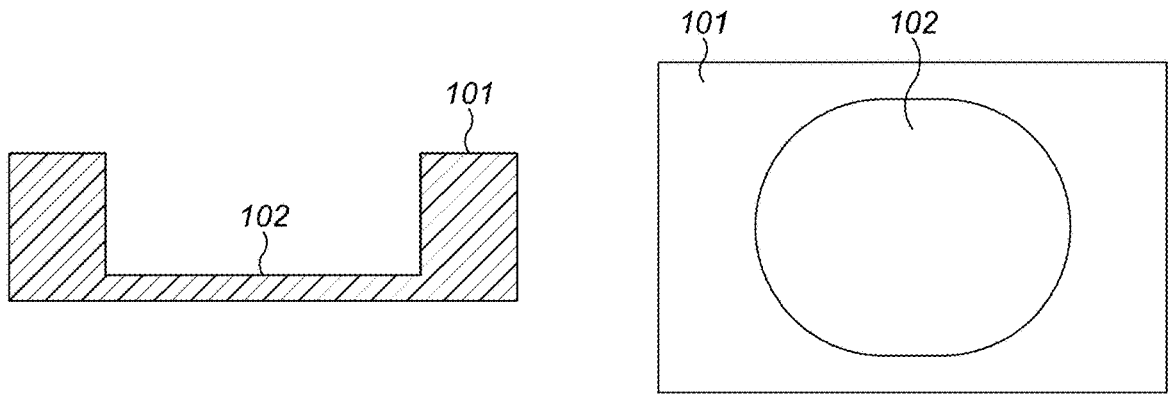
FIGS. 1A to 1E illustrate a first known technique for manufacturing a substrate including an embedded magnetic component.
Figure 1B:
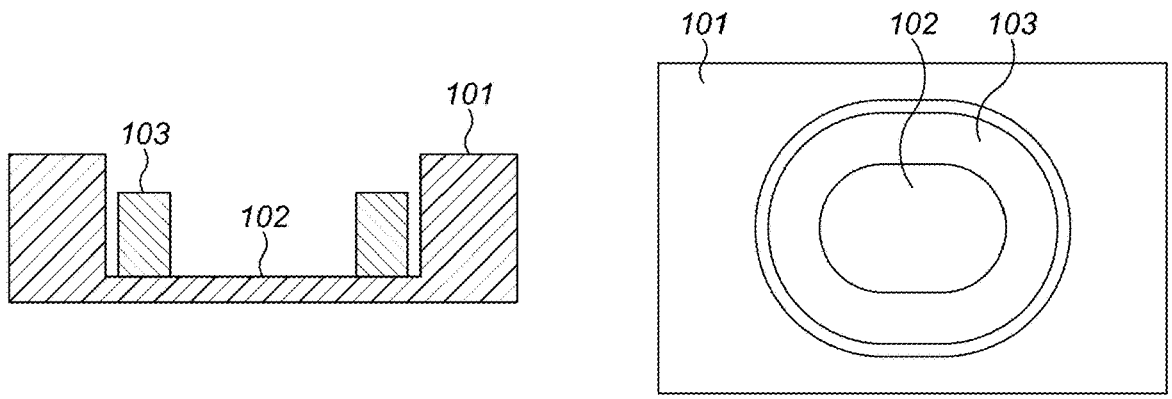
Figure 1C:
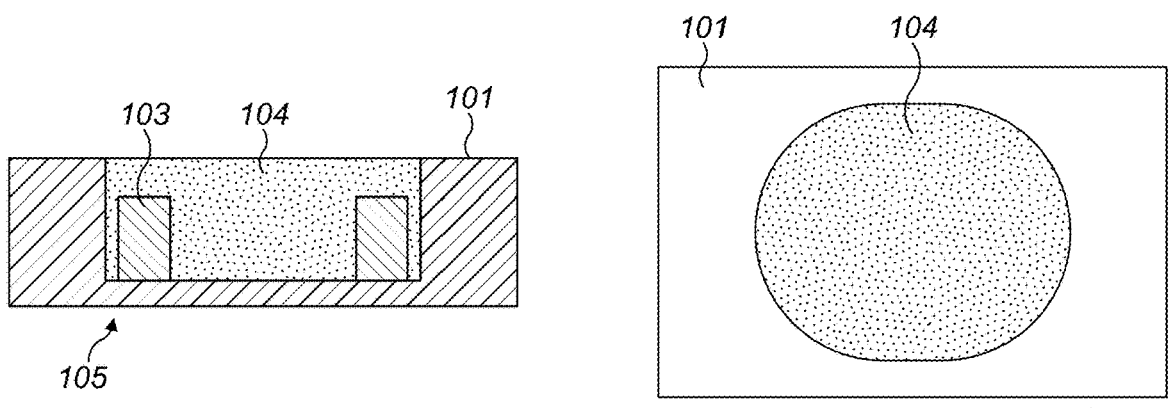
Figure 1D:
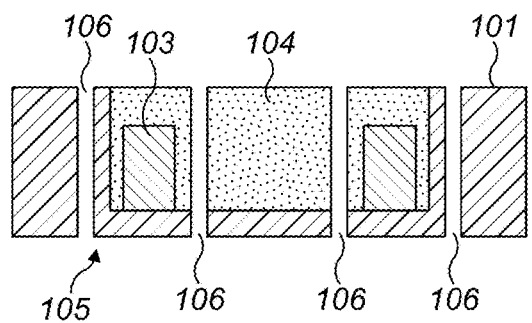
Figure 1D:
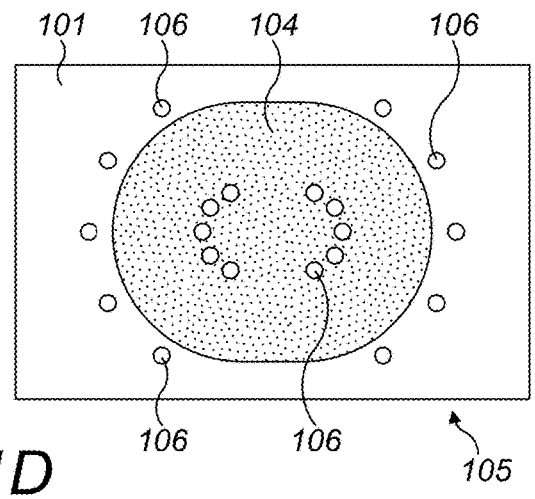
Figure 1E:
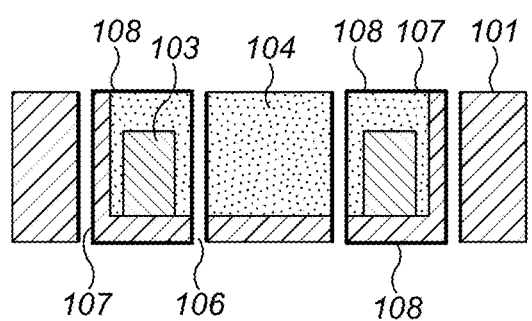
Figure 1E:
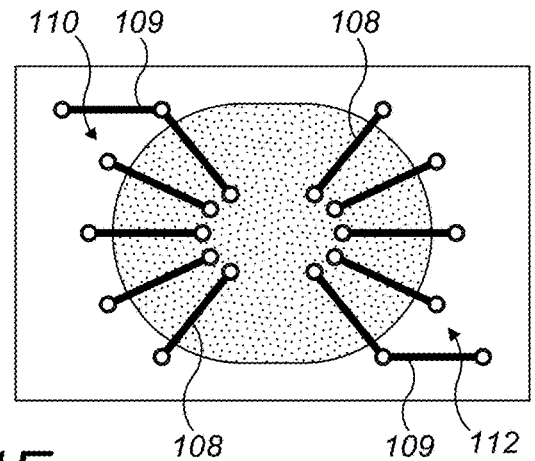
Figure 2A:
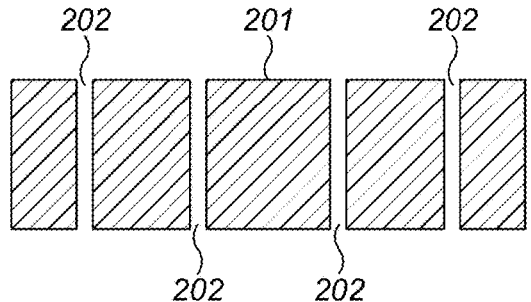
FIGS. 2A to 2F illustrate a second known technique for manufacturing a substrate including an embedded magnetic component.
Figure 2A:
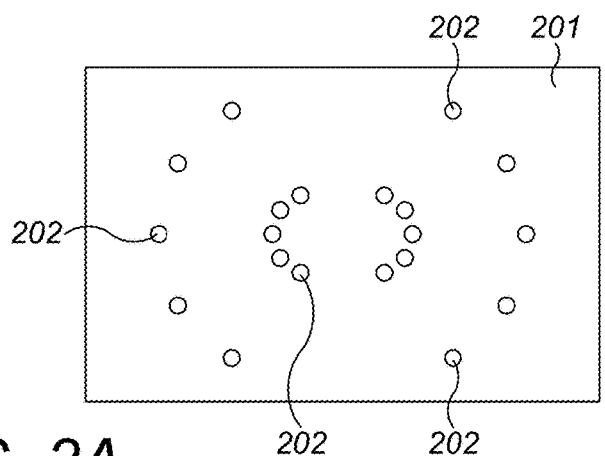
Figure 2B:
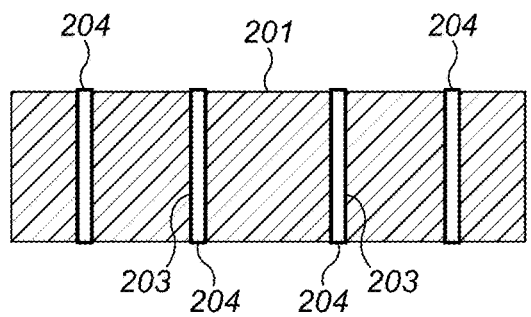
Figure 2B:
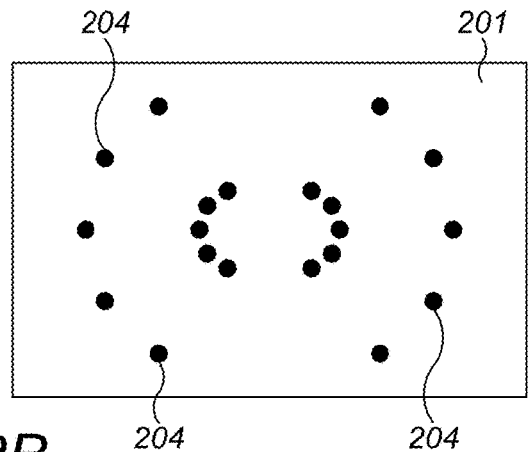
Figure 2C:
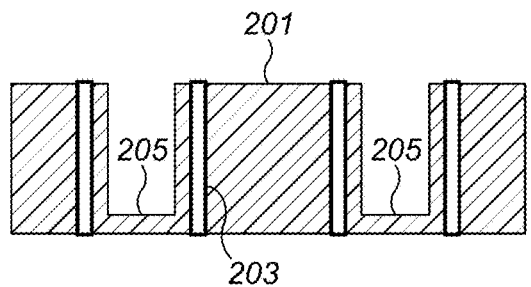
Figure 2C:
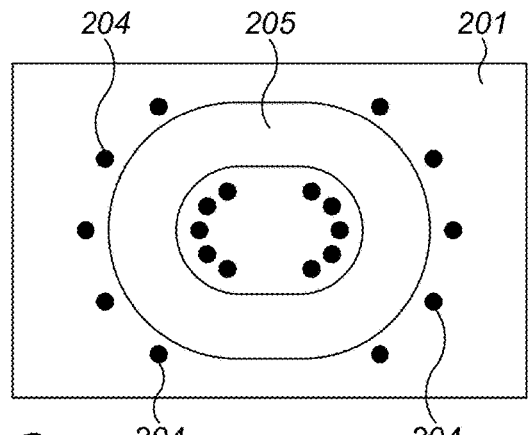
Figure 2D:
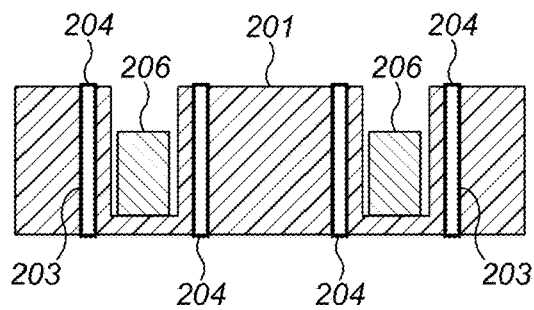
Figure 2D:
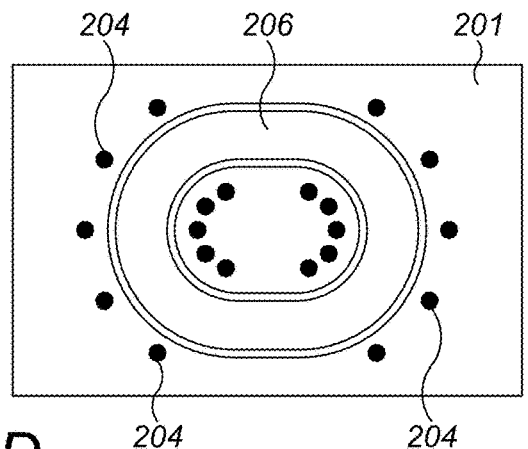
Figure 2E:
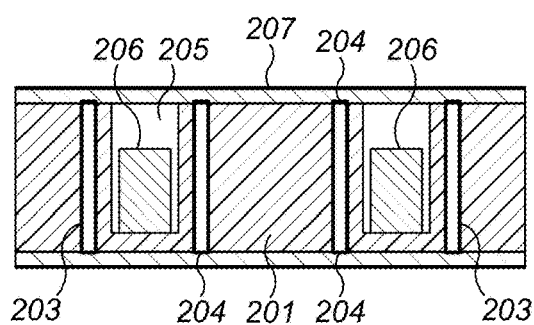
Figure 2E:
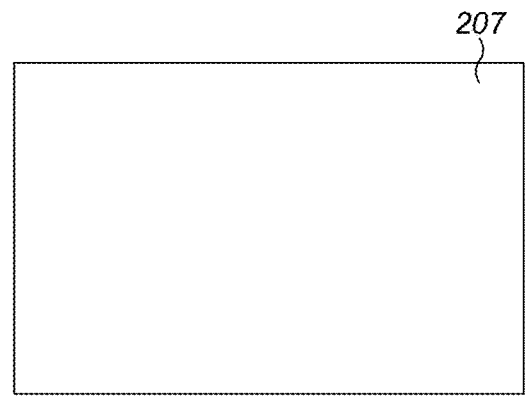
Figure 2F:
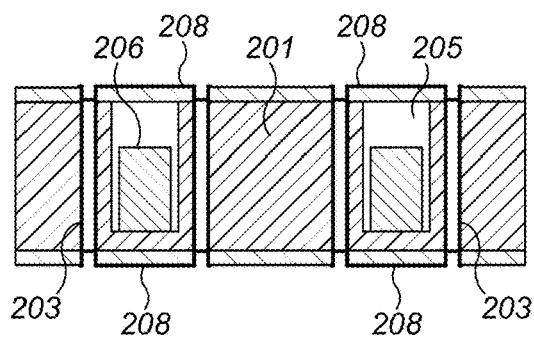
Figure 2F:
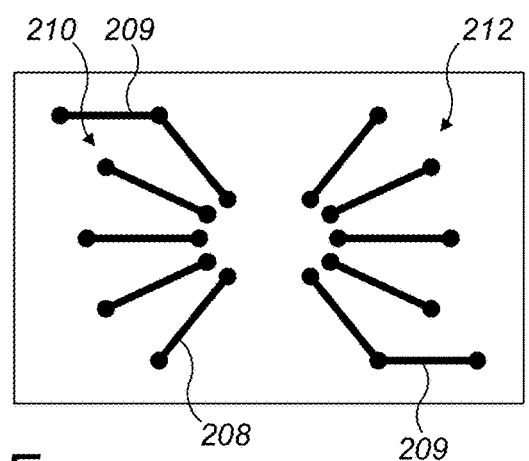
Figure 3A:
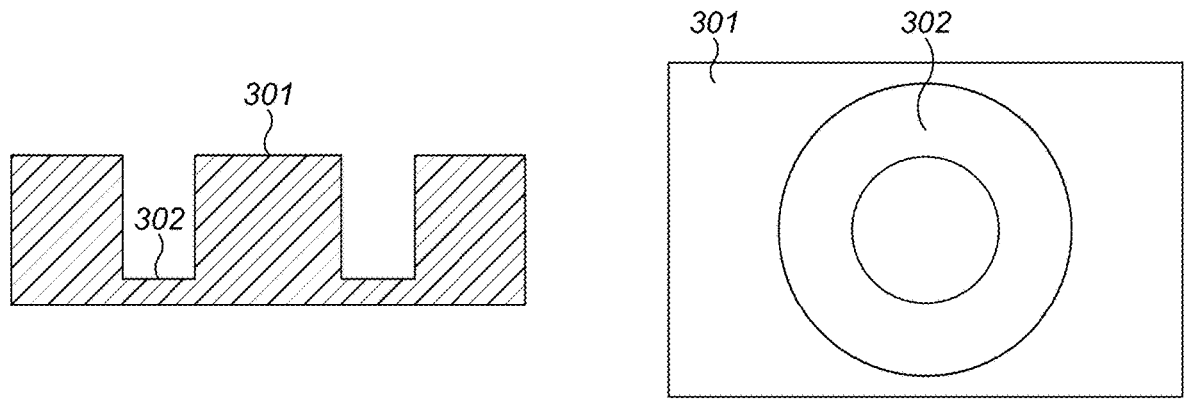
FIGS. 3A to 3F show a technique for manufacturing the device according to a first preferred embodiment of the present invention.

In a first step, illustrated in FIG. 3A, a cavity 302 that houses a magnetic core is routed in an insulating substrate 301. In this preferred embodiment, the insulating substrate 301 is formed of a resin material, such as FR4. FR4 is a composite 'pre-preg' material composed of woven fiberglass cloth impregnated with an epoxy resin binder. The resin is pre-dried, but not hardened, so that when it is heated, it flows and acts as an adhesive for the fiberglass material. FR4 has been found to have favorable thermal and insulation properties.

Figure 3B:
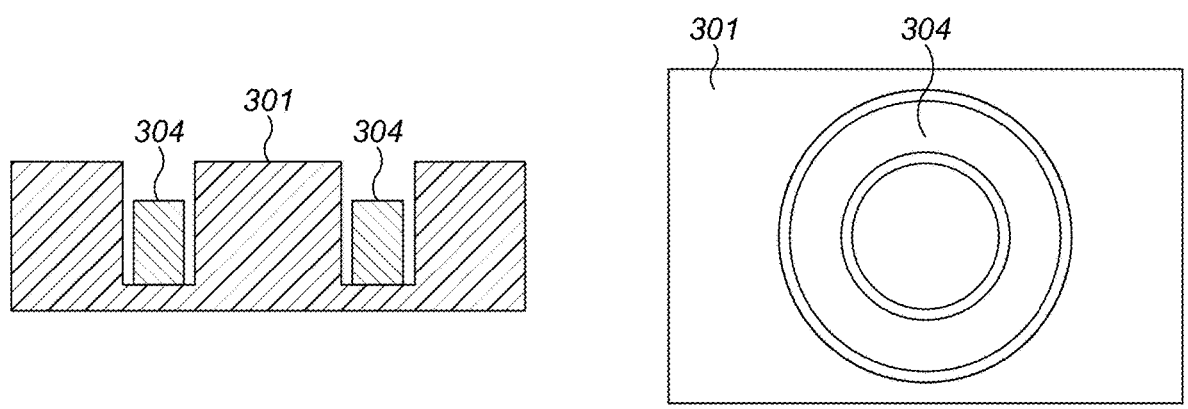

As shown in FIG. 3B, a circular magnetic core 304 is then installed in the cavity 302. The cavity 302 may be slightly larger than the magnetic core 304, so that an air gap may exist around the magnetic core 304. The magnetic core 304 may be installed in the cavity manually or by a surface mounting device such as a pick and place machine.

Figure 3C:
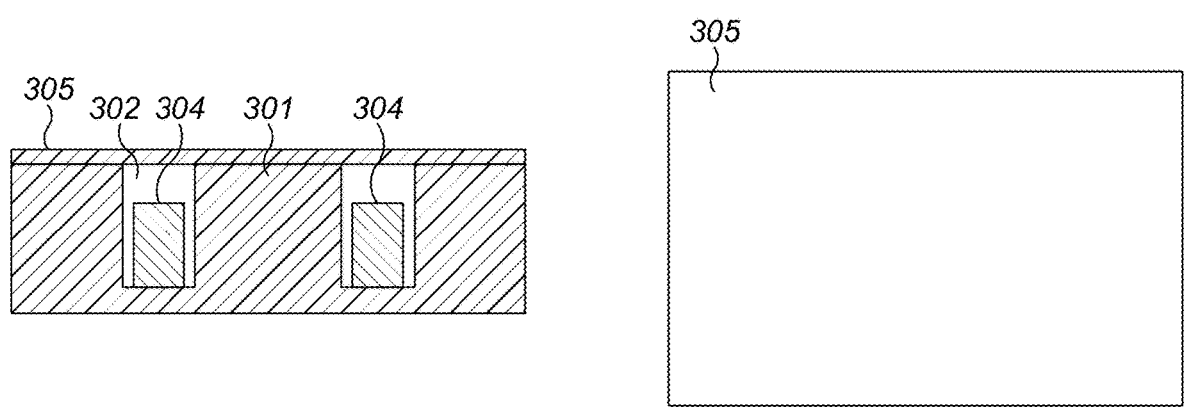

In the next step, illustrated in FIG. 3C, a first insulating layer 305 or cover layer is secured or laminated on the insulating substrate 301 to cover the cavity 302 and the magnetic core 304. Preferably, the cover layer 305 is formed of the same material as the insulating substrate 301 as this aids bonding between the top surface of the insulating substrate 301 and the lower surface of the cover layer 305. The cover layer 305 may therefore also be formed of a material such as FR4, laminated onto the insulating substrate 301. Lamination may be via adhesive or via heat activated bonding between layers of pre-preg material. In other preferred embodiments, other materials may be used for the cover layer 305.

Figure 3D:
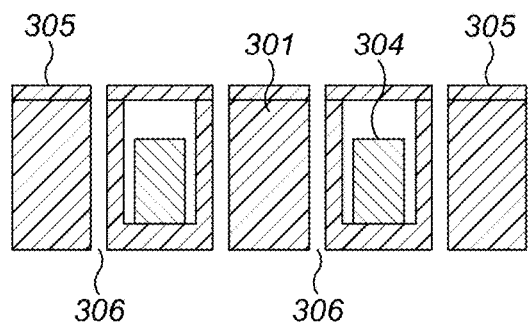
Figure 3D:
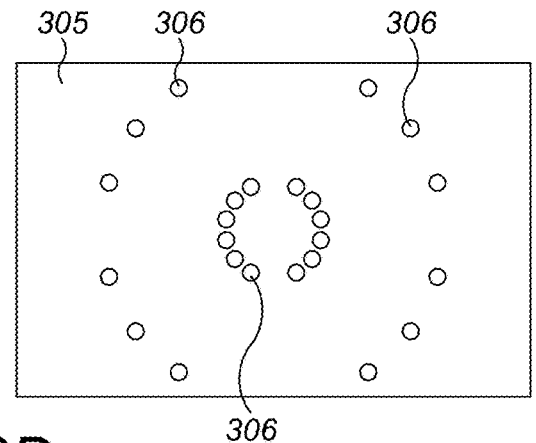
Figure 4A:
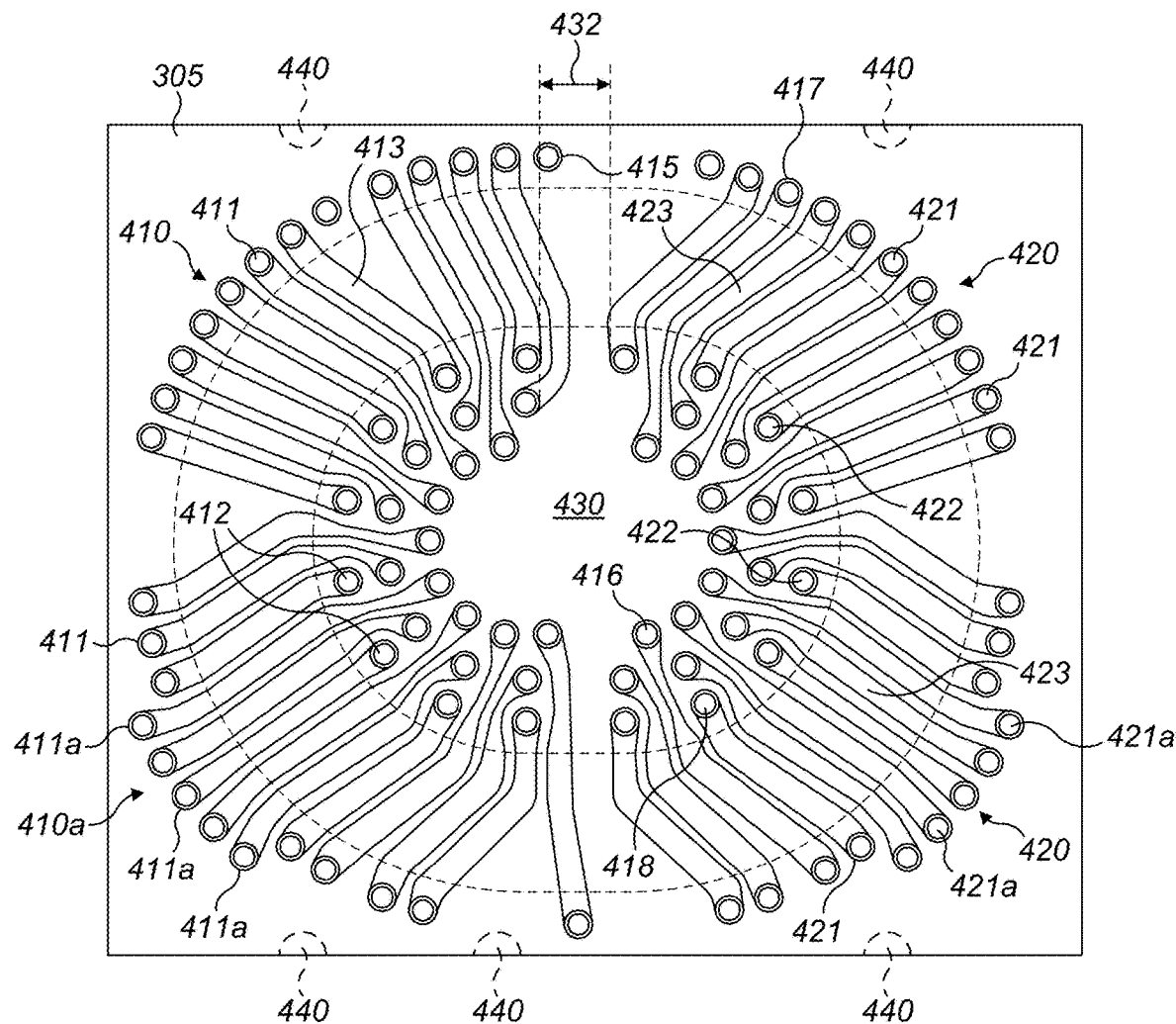
FIG. 4A illustrates a top down view of the cavity, the magnetic core, and the conductive vias.
Figure 4B:
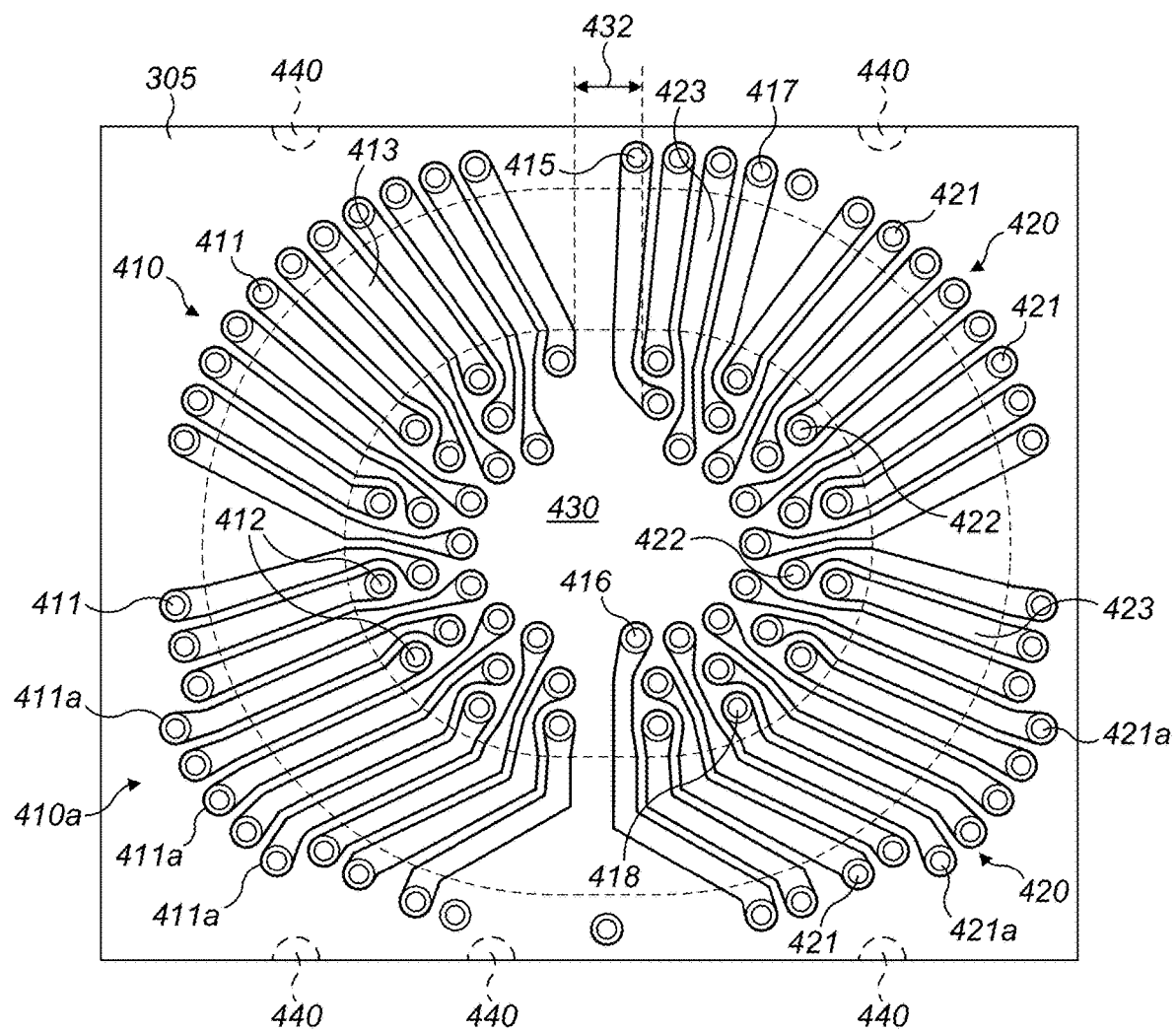
FIG. 4B illustrates the reverse side of the device and cavity.
Figure 4C:
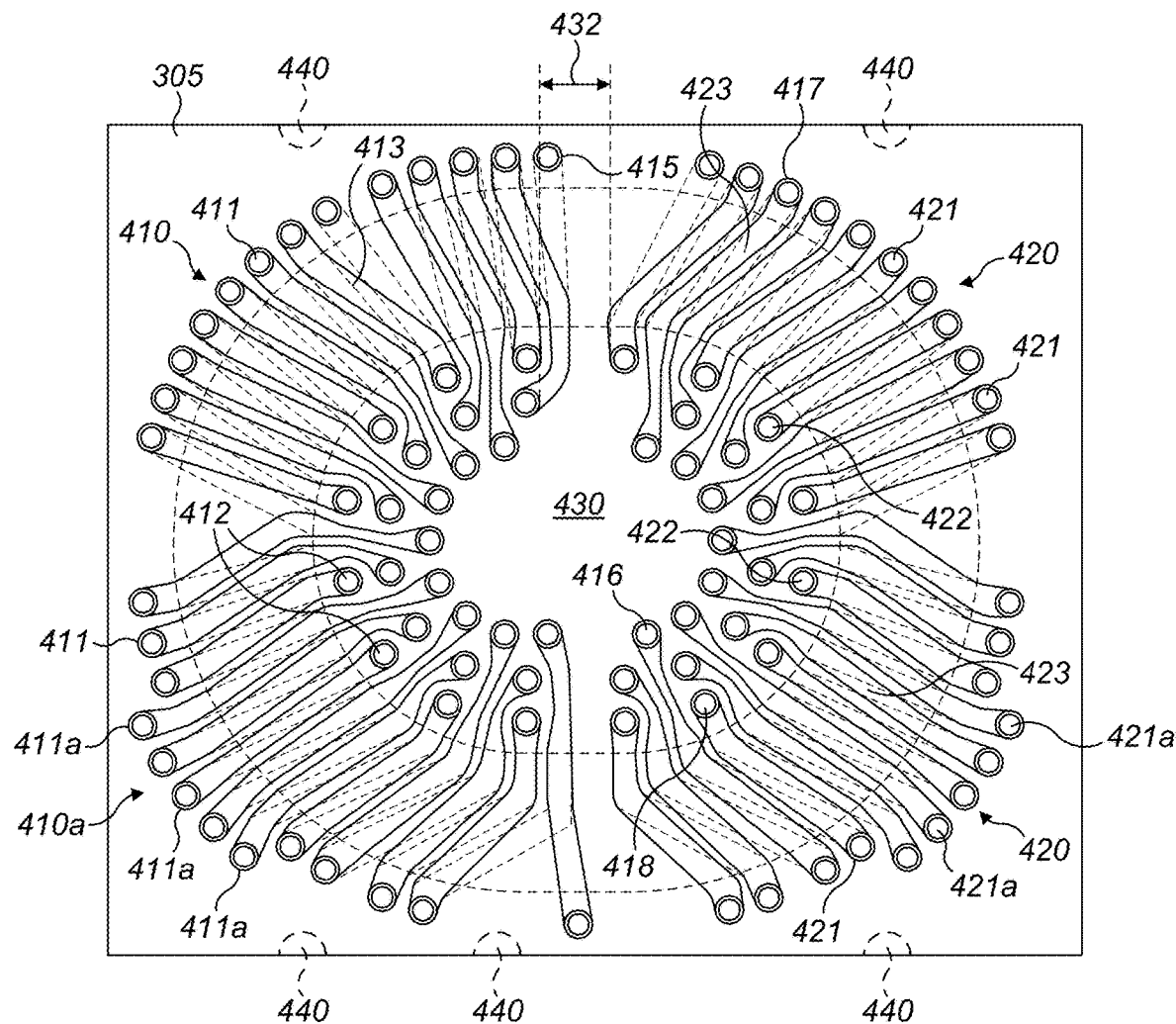
FIG. 4C is a schematic illustration of the conductive vias showing the trace pattern connecting adjacent vias together to define the windings.

In the next step illustrated in FIG. 3D, though-holes 306 are formed through the insulating substrate 301 and the cover layer 305. The through holes 306 are formed at suitable locations to form the primary and secondary coil conductor windings of an embedded transformer. In this preferred embodiment, as the transformer has the magnetic core 304 that is round or circular in shape, the through-holes 306 are therefore suitably formed along sections of two arcs corresponding to inner and outer circular circumferences. As is known in the art, the through-holes 306 may be formed by drilling, or other suitable technique. A schematic illustration of an example pattern of conductive vias is shown in FIGS. 4A-4C and described below.

Figure 3E:
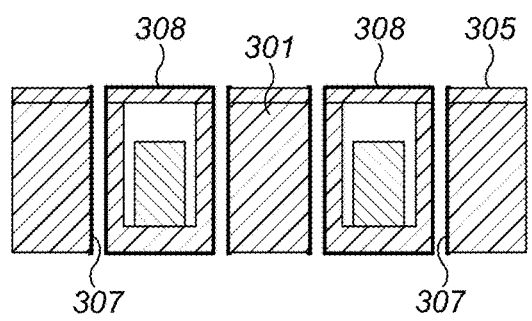
Figure 3E:
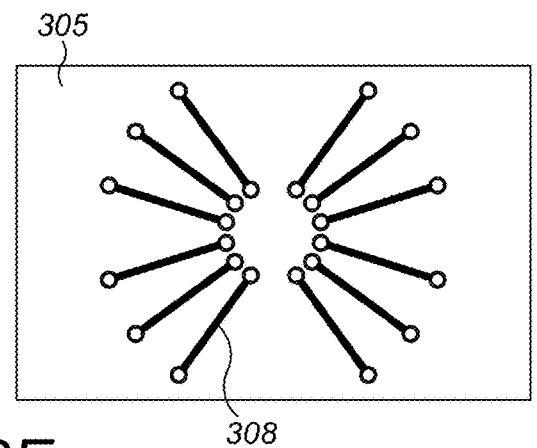
Figure 3F:
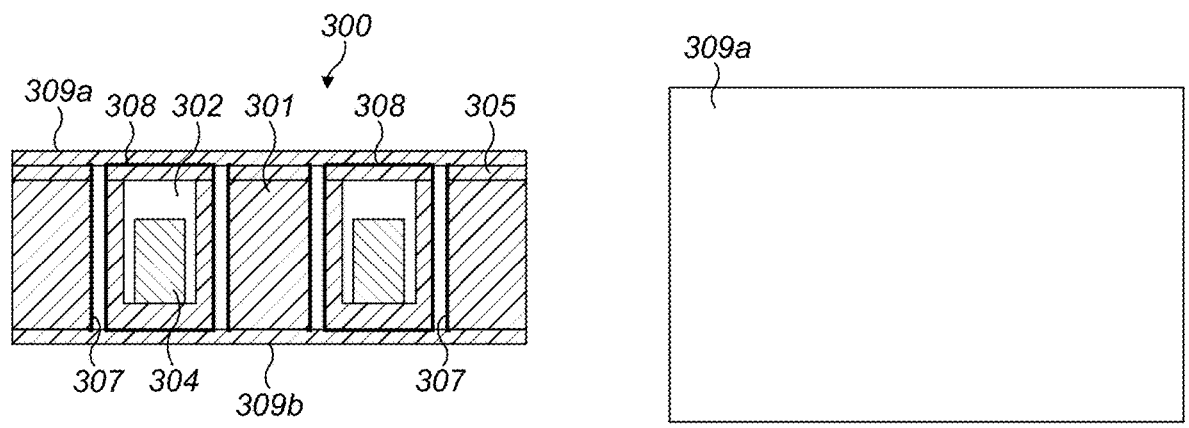

As shown in FIG. 3E, the though-holes 306 are then plated to form conductive via holes 307 that extend from the top surface of the cover layer 305 to the bottom surface of the substrate 301. Conductive or metallic traces 308 are added to the top surface of the cover layer 305 to form an upper winding layer connecting the respective conductive via holes 307, and in part forming the windings of the transformer. The upper winding layer is illustrated by way of example in the right hand side of FIG. 3E. The metallic traces 308 and the plating for the conductive via holes 307 are usually formed from copper, and may be formed in any suitable way, such as by adding a copper conductor layer to the outer surfaces of the cover layer 305 which is then etched to form the necessary patterns, deposition of the copper onto the surface, and so on.

Metallic traces 308 are also formed on the bottom surface of the insulating substrate 301 to define a lower winding layer also connecting the respective conductive via holes 307 to partly form the windings of the transformer. The upper and lower winding layers 308 and the via holes 307 together define the primary and secondary windings of the transformer.

Lastly, as shown in FIG. 3F, second and third insulating layers 309 are formed on the top and bottom surfaces of the structure shown in FIG. 3E to define first and second isolation barriers. The layers may be secured in place by lamination or other suitable technique. The bottom surface of the second insulating layer or first isolation barrier 309a adheres to the top surface of the cover layer 305 and covers the terminal lines of the upper winding layer 308. The top surface of the third insulating layer or second isolation barrier 309b on the other hand adheres to the bottom surface of the substrate 301 and so covers the terminal lines of the lower winding layer 308. Advantageously, the second and third insulating layers, i.e., first isolation barrier 309a and second isolation barrier 309b, may also be formed of FR4, and so laminated onto the insulating substrate 301 and cover layer 305 using the same process as for the cover layer 305.

Through holes and via conductors can be formed through the second and third insulating layers, i.e., first isolation barrier 309a and second isolation barrier 309b, in order to connect to the input and output terminals of the primary and second transformer windings (not shown). Where the conductive vias holes through the second and third insulating layers, i.e., first isolation barrier 309a and second isolation barrier 309b, are located apart from the vias through the substrate 301 and the cover layer 305, a metallic trace will be needed on the upper winding layer connecting the input and output vias to the first and last via in each of the primary and secondary windings. Where the input and output vias are formed in overlapping positions, then conductive or metallic caps could be added to the first and last via in each of the primary and secondary windings.

FIG. 3F illustrates a finished embedded magnetic component device 300 according to a first preferred embodiment of the present invention. The first and second isolation barriers 309a and 309b define a solid bonded joint with the adjacent layers, either cover layer 305 or substrate 301, on which the upper or lower winding layers 308 of the transformer are formed. The first and second isolation barriers 309a and 309b therefore provide a solid insulated boundary along the surfaces of the embedded magnetic component device, greatly reducing the chance of arcing or breakdown, and allowing the isolation spacing between the primary and secondary side windings to be greatly reduced.

To meet the insulation requirements of EN/UL60950 only 0.4 mm is required through a solid insulator for mains referenced voltages (250 Vrms), for example.

The first and second isolation barriers 309a and 309b are formed on the substrate 301 and cover layer 305 without any air gap between the layers. If there is an air gap in the device, such as above or below the winding layers, then there would be a risk of arcing and failure of the device. The first and second isolation barriers 309a and 309b, the cover layer 305 and the substrate 301, therefore define a solid block of insulating material.

Figure 3G:
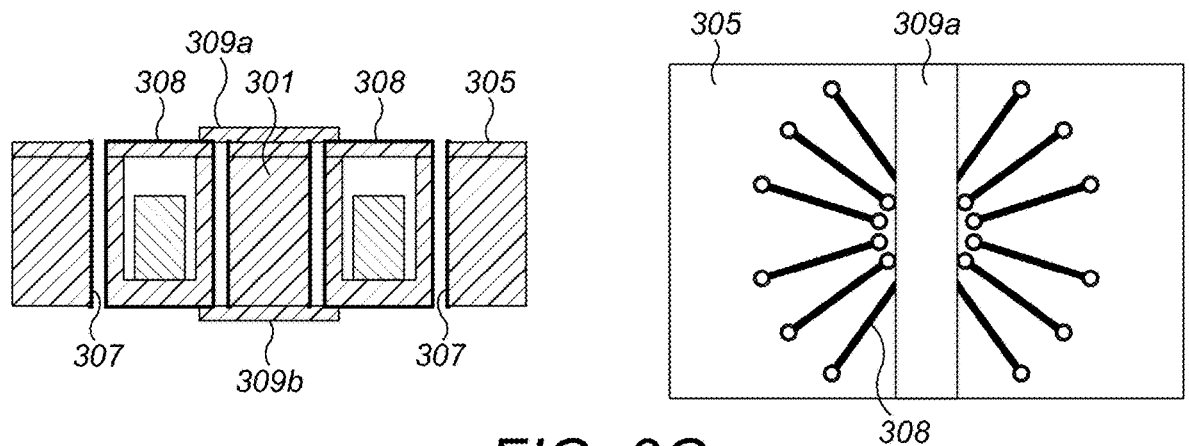
FIG. 3G shows a variation on the device shown in FIG. 3F.

In the above-described figures, the first and second isolation barriers 309a and 309b are illustrated preferably as covering the whole of the cover layer 305 and the bottom surface of the substrate 301 of the embedded magnetic component device 300. In alternative preferred embodiments, however, it may be sufficient if the first and second isolation barriers are applied to the cover layer 305 and the bottom of the substrate 301 so that they at least cover only the portion of the surface of the cover layer 305 and substrate 301 surface between the primary and secondary windings, where the primary and secondary windings are closest. In FIG. 3G for example, the first and second isolation barriers 309a and 309b may be provided as a long strip of insulating material placed on the surface parallel or substantially parallel to the shorter edge of the device and covering at least the isolation region 430 (see FIGS. 4A-4C below) between the primary and secondary side windings. In alternative preferred embodiments, as the primary and secondary side windings follow the arc of the magnetic core 304 around which they are wound, it may be sufficient to place the isolation barriers 309a and 309b only where the primary and secondary side windings are closest, which in this case is at the 12 o'clock and 6 o'clock positions. As noted above, however, a full layer of the first and second isolation barriers 309a and 309b covering the entire surface of the embedded component device can be advantageous as it provides locations for further mounting of components on the surface of the device.

The pattern of through holes 306, conductive vias 307, and metallic traces 308 defining the upper and lower winding layers of the transformer will now be described in more detail with reference to FIG. 4A. FIG. 4A is a top view of the embedded magnetic component device with the upper winding layer exposed. The primary windings 410 of the transformer are shown on the left hand side of the device, and the secondary windings 420 of the transformer are shown on the right hand side. One or more tertiary or auxiliary transformer windings may also be formed, using the conductive vias 307 and metallic traces 308 but are not illustrated in FIG. 4A. In FIG. 4A, input and output connections to the transformer windings are also omitted to avoid obscuring the detail.

The primary winding of the transformer 410 includes outer conductive connectors or vias 411 arranged around the outer periphery of the cavity 302 containing the magnetic core 304. As illustrated in FIG. 4A, the outer conductive vias 411 closely follow the outer circumference or periphery of the cavity 302 and are arranged in a row, along a section of arc.

Inner conductive connectors or vias 412 are provided in the inner or central isolation region of the substrate 301 and are arranged in rows adjacent the inner circumference of the cavity 302 containing the magnetic core 304. Owing to the smaller radius circumscribed by the inner cavity wall compared to the outer cavity wall, there is less space to arrange the inner conductive vias 412 compared to the outer conductive vias 411. As a result, the inner conductive vias 412 are staggered and arranged broadly in two or more rows having different radii. Some of the inner conductive vias 412 in the primary winding are therefore located closer to the wall of the cavity 302 than the other inner conductive vias 412, which are located closer to the central portion of the device. In FIGS. 4A-4C, the inner conductive vias 412 can be seen to be arranged in three rows, for example.

Each outer conductive via 411 in the upper winding layer 308 is connected to a single inner conductive via 412 by a metallic trace 413. The metallic traces 413 are formed on the surface of the cover layer 305 and so cannot overlap with one another. Although, the inner conductive vias 412 need not be arranged in rows, it is helpful to do so, as an ordered arrangement of the inner conductive vias 412 assists in arranging the metallic traces 413 so that they connect the outer conductive vias 411 to the inner conductive vias 412.

In at least one region, the outer conductive vias 411a of the primary winding are spaced farther away from the periphery of the cavity than the other outer conductive vias 411. For example, in FIGS. 4A-4C, in the region indicated 410a includes a plurality of outer conductive vias 411a arranged along a section of arc having a greater radius than that of the other outer conductors 411. The greater radius of the arc means that the conductive vias in region 410a can have a larger circumference than those that are closer to the periphery of the cavity 302, without the conductive vias 411a being closer to one another. This stepped-out feature and the associated larger diameter of the vias in regions 410a and 420a mean that the overall parameters for tolerances and spacing between current carrying components can be preserved. This would not be possible for the inner conductive vias 412, for example, which, due to the limited space in the central isolation region, tend to be more restrained in their size.

The larger circumference of the via holes 411a also means that the cross-sectional area of via holes 411a may be greater than the other via holes 411 spaced around the periphery of the magnetic core. Overall, the conductive vias 411a in region 410a may therefore present less electrical resistance to the current flowing through the primary winding and improves the electrical characteristics of the device.

In FIGS. 4A-4C, regions 410a and 420a containing the conductive vias 411a and 421a are located at substantially at the 4 o'clock and 8 o'clock positions respectively, essentially in or towards the corners of the rectangular substrate. However, it may be possible to locate the stepped out portions at other positions around the periphery of the magnetic core. The stepped-out feature allows more vias to be fitted around the outer edge of the magnetic core, and allows larger vias to be formed.

The secondary winding of the transformer 420 also includes outer conductive vias 421 and inner conductive vias 422 connected to each other by respective metallic traces 423 in the same way as for the primary winding. As with the primary winding, in at least one region 420a, the outer conductive vias 421a of the secondary primary winding are located farther away or stepped-out from the periphery of the cavity 302 than the other outer conductive vias 421, and have larger circumferences and cross-sectional area to thereby present less electrical resistance to the current flowing through the windings. Despite the increase in diameter of the outer conductive vias 411a and 421a in regions 410a and 420a, the overall size of the device is unaffected.

The lower winding layer 308 of the transformer is arranged in the same way, and is illustrated in FIG. 4B. The conductive vias are arranged in identical or complementary locations to those in the upper winding layers. However, in the lower winding layer 308 the metallic traces 413, 423 are formed to connect each outer conductive via 411, 421 to an inner conductive via 412, 422 adjacent to the inner conductive via 412, 422 to which it was connected in the upper winding layer. In this way, the outer conductive vias 411, 421 and inner conductive vias 421, 422, and the metallic traces 413, 423 on the upper and lower winding layers 308 define coiled conductors around the magnetic core 304. This is illustrated by way of example in FIG. 4C which shows the connection between adjacent vias in the inner and outer regions by way of the dotted or broken lines. The number of conductive vias allocated to each of the primary and secondary windings determines the winding ratio of the transformer.

In FIGS. 4A and 4B, optional terminations 440 formed in the substrate 301 of the device are also shown. These may take the form of edge castellations providing for Surface Mount Application (SMA) connections from the device to a printed circuit board on which the device may be mounted.

Additionally, input and output connections to the transformer windings are illustrated by vias 415, 416, 417, and 418.

In an isolated DC-DC converter, for example, the primary winding 410 and the secondary winding 412 of the transformer must be sufficiently isolated from one another. In FIG. 4A, the central region of the substrate 301, the region circumscribed by the inner wall of the cavity 302, defines an isolation region 430 between the primary and the secondary windings. The minimum distance between the inner conductive vias 412 and 422 of the primary and secondary windings 410 and 420 is the insulation distance, and is illustrated in FIGS. 4A-4C by arrow 432.

Due to first and second isolation barriers 309a and 309b, the second and the third insulating layers, provided in the present preferred embodiment, the distance 432 between the primary and secondary side can be reduced to about 0.4 mm, for example, allowing significantly smaller devices to be produced, as well as devices with a higher number of transformer windings.

The second and third insulating layers need only be on the top and bottom of the device in the central region between the primary and secondary windings. However, in practice it is advantageous to make the second and third insulating layers cover the same area as that of the cover layer 305 and substrate 301 on which they are formed. As will be described below, this provides a support layer for a mounting board on top, and provides additional insulation between the components on that board, and the transformer windings underneath.

The preferred thickness of the first and second isolation barriers 309a and 309b may depend on the safety approval required for the device as well as the expected operating conditions. For example, FR4 has a dielectric strength of around 750 V/mm, and if the associated magnitude of the electric field used in an electric field strength test were to be 3000 V, such as that which might be prescribed by the UL60950-1 standard, a minimum thickness of 0.102 mm would be required for the first and second isolation barriers 309a and 309b. The thickness of the first and second isolation barriers 309a and 309b could be greater than this, subject to the desired dimensions of the final device. Similarly, for test voltages of 1500 V and 2000 V, the minimum thickness of the first and second isolation barriers 309a and 309b, if formed of FR4 would be 0.051 mm and 0.068 mm respectively, for example.

Although solder resist may be added to the exterior surfaces of the second and third insulating layers, i.e., the first and second isolation barriers 309a and 309b, this is optional in view of the insulation provided by the layers themselves.

Although in the preferred embodiment described above, the substrate 301, the cover layer 305, and the first and second isolation barriers 309a and 309b are made of FR4, any suitable PCB laminate system having a sufficient dielectric strength to provide the desired insulation may be included. Non-limiting examples include FR4-08, G11, and FR5.

As well as the insulating properties of the materials themselves, the cover layer 305 and the insulating layer 309 must bond well with the substrate 301 to form a solid bonded joint. The term solid bonded joint means a solid consistent bonded joint or interface between two materials with little voiding. Such joint should keep its integrity after relevant environmental conditions, for example, high or low temperature, thermal shock, humidity, and so on. Well-known solder resist layers on PCB substrates cannot form such solid bonded joint, and therefore the cover layer 305 and insulating layer 309 are different from such solder resist layers. For this reason, the material for the extra layers is preferably the same as the substrate 301, as this improves bonding between them. The cover layer 305, the insulating layer 309, and the substrate 301 could however be made of different materials providing there is sufficient bonding between them to form a solid body. Any material chosen preferably has good thermal cycling properties so as not to crack during use and would preferably be hydrophobic so that water would not affect the properties of the device.

In other preferred embodiments, the insulating substrate 301 could be formed from other insulating materials, such as ceramics, thermoplastics, and epoxies. These may be formed as a solid block with the magnetic core 304 embedded inside. As before, cover layer 305 and first and second isolation barriers 309a and 309b would then be laminated onto the substrate 301 to provide the additional insulation.

The magnetic core 304 is preferably a ferrite core as this provides the device with the desired inductance. Other types of magnetic materials, and even air cores, that is an unfilled cavity formed between the windings of the transformer are also possible in alternative preferred embodiments. Although, in the examples above, the magnetic core is toroidal in shape, it may have a different shape in other preferred embodiments. Non-limiting examples include, an oval or elongate toroidal shape, a circular shape having a gap, EE, EI, I, EFD, EP, UI and UR core shapes. In the present example, a round or an oval toroid shape was found to be the most robust and to provide sufficient space to locate the conductive vias around the magnetic core. The magnetic core 304 may be coated with an insulating material to reduce the possibility of breakdown occurring between the conductive magnetic core 304 and the conductive vias 307 or metallic traces 308. The magnetic core 304 may also have chamfered edges providing a profile or cross section that is rounded.

Furthermore, although the embedded magnetic component device illustrated above uses conductive vias 307 to connect the upper and lower winding layers 308, in alternative preferred embodiments, other connections could be used, such as conductive pins, wires, or filaments. The conductive pins could be inserted into the through holes 306 or could be preformed at appropriate locations in the insulating substrate 301 and cover layer 305. In this sense, the conductive vias 307 or indeed their equivalents if provided as pins, wires, or filaments may be referred to more generally as interlayer conductive winding sections, while the metallic traces 308 or their equivalent as a pin, wire or filament may be referred to more generally as an intra-layer conductive sections. The term intra-layer is used to indicate that the conductive winding sections of the upper and lower winding layers occur substantially on the same layer or layers of the device, while the term interlayer is used to indicate that the conductive winding sections cut through the device passing from the upper winding layer to the lower winding layer.

In this description, the terms top, bottom, upper, and lower are used only to define the relative positions of features of the device with respect to each other and in accordance with the orientation shown in the drawings, that is with a notional z axis extending from the bottom of the page to the top of the page. These terms are not therefore intended to indicate the necessary positions of the device features in use, or to limit the position of the features in a general sense.

Second Preferred Embodiment

A second preferred embodiment of the present invention will be described with reference to FIG. 5.

In the first preferred embodiment, the lower winding layer of the transformer primary windings 410 and secondary windings 412 preferably is formed directly on the lower side of the insulating substrate 301, and the second isolation barrier 309b is subsequently laminated onto the insulating substrate 301 over the lower winding layer 308.

In the second preferred embodiment, the structure of the device 300a preferably is identical to that described in FIGS. 3A-3F, but in the step illustrated in FIG. 3C, before the through holes 306 are formed, an additional layer, a fourth insulating layer or second cover layer 305b, is laminated onto the insulating substrate 301. The through holes 306 are then formed though the substrate 301, and the first insulating layer 305a and fourth insulating layer 305b, and the through holes 306 are plated to form conductive vias 307. Thus, as illustrated in FIG. 5, in this preferred embodiment, when the lower winding layer 308 is formed, in the step previously illustrated in FIG. 3E, it is formed on the second cover layer 305b, rather than on the lower side of the insulating substrate 301.

The second cover layer 305b provides additional insulation for the lower winding layer 308.

Third Preferred Embodiment

In addition to significantly improving the electrical insulation between the primary and secondary side windings of the transformer, the first and second isolation barriers 309a and 309b usefully define and function as the mounting board on which additional electronic components can be mounted. This allows insulating substrate 301 of the embedded magnetic component device to act as the PCB of more complex devices, such as power supply devices. In this regard, power supply devices may include DC-DC converters, LED driver circuits, AC-DC converters, inverters, power transformers, pulse transformers, and common mode chokes, for example. As the transformer component is embedded in the substrate 301, more board space on the PCB is available for the other components, and the size of the device can be made small.

Figure 6:
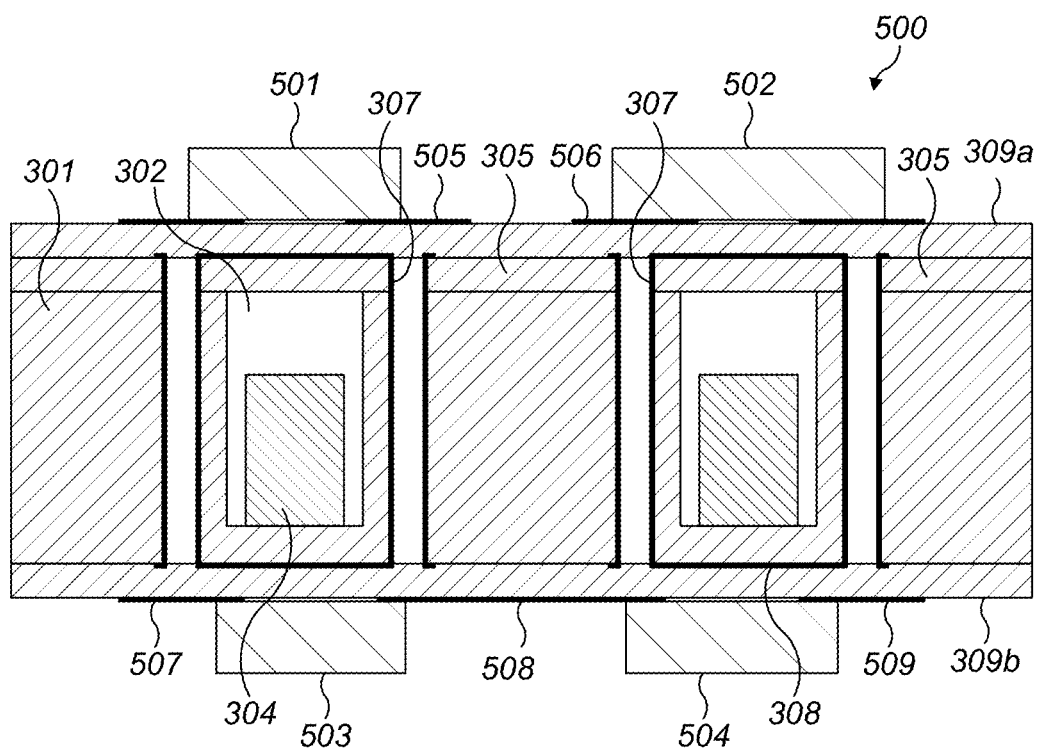
FIG. 6 illustrate a third preferred embodiment of the present invention, incorporating the embedded magnetic component device of FIG. 3A-3F or 5 into a larger device.

A third preferred embodiment of the present invention will therefore now be described with reference to FIG. 6. FIG. 6 shows example electronic components 501, 502, 503 and 504 surface mounted on the first and second isolation barriers 309a and 309b. These components may include one or more resistors, capacitors, and switching devices, such as transistors, integrated circuits, and operational amplifiers, for example. Land grid array (LGA) and Ball Grid Array components may also be provided on the first and second isolation barriers 309a and 309b.

Before the electronic components 501, 502, 503, and 504 are mounted on the mounting surface, a plurality of metallic traces are formed on the surfaces of the first and second isolation barriers 309a and 309b to make suitable electrical connections with the components. The metallic traces 505, 506, 507, 508, and 509 are formed in suitable positions for the desired circuit configuration of the device. The electronic components 501, 502, 503, and 504 can then be surface mounted on the device and secured in place by reflow soldering, for example. One or more of the surface mounted components 501, 502, 503, and 504 preferably connects to the primary windings 410 of the transformer, while one or more further components 501, 502, 503, and 504 preferably connects to the secondary windings 420 of the transformer.

Figure 5:
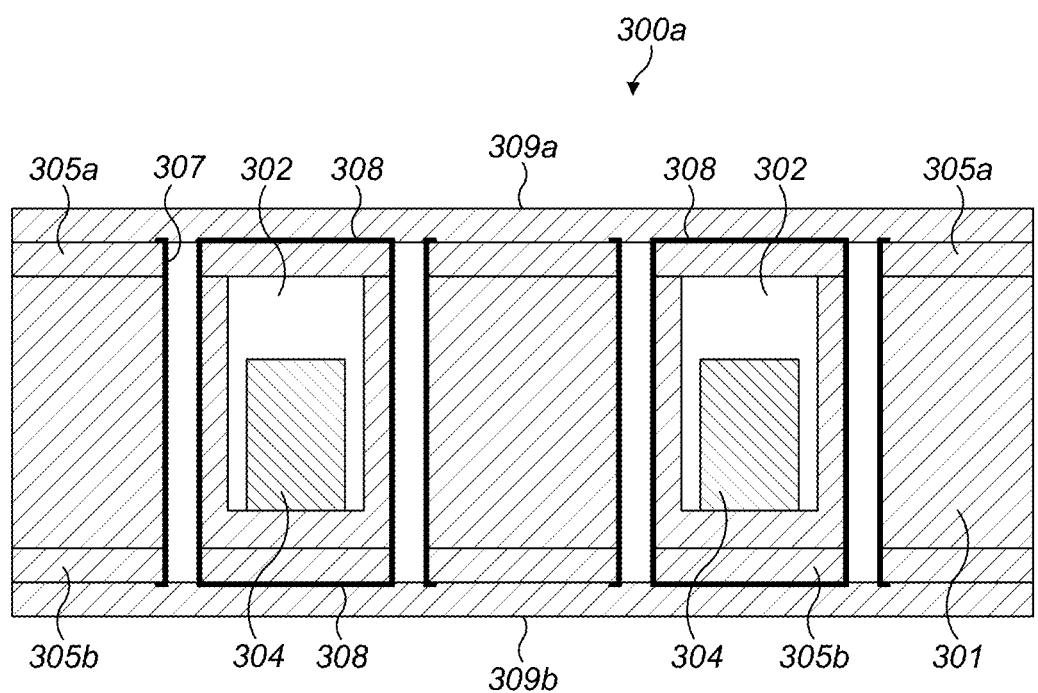
FIG. 5 illustrates a second preferred embodiment of the present invention.

The resulting power supply device 500 shown in FIG. 6 may be constructed based on the embedded magnetic component devices 300 and 300a shown in FIG. 3F, 4, or 5, for example.

Fourth Preferred Embodiment

Figure 7:
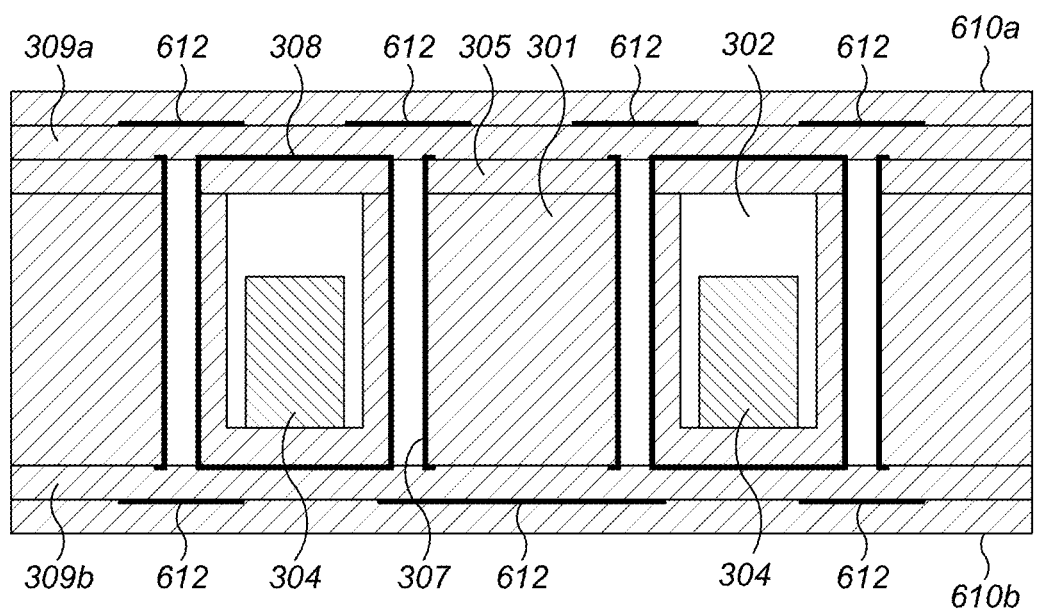
FIG. 7 illustrates a fourth preferred embodiment of the present invention including additional layers of insulating material.

A fourth preferred embodiment of the present invention will now be described with reference to FIG. 7. The embedded magnetic component of FIG. 7 is identical to that of FIGS. 3F and 5 except that further insulating layers are provided on the device. In FIG. 7, for example additional metallic traces 612 are formed on the first and second isolation barriers 309a and 309b, and fifth and sixth insulating layers 610a and 610b are then formed on the metallic traces 612. As before, the fifth and sixth insulating layers 610a and 610b can be secured to the first and second isolation barriers 309a and 309b by lamination or adhesive. Alternatively to being formed on the first and second isolation barriers 309a and 309b, the fifth and sixth insulating layers 610a and 610b may be provided by constructing the first and second isolation barriers 309a and 309b to have a plurality of layers, such that the fifth and sixth insulating 610a and 610b layers are part of the first and second isolation barriers 309a and 309b.

The fifth and sixth insulating layers 610a and 610b provide additional depth in which circuit lines can be constructed. For example, the metallic traces 612 can be an additional layer of metallic traces to metallic traces 505, 506, 507, 508, and 509, allowing more complicated circuit patterns to be formed. Metallic traces 505, 506, 507, 508, and 509 on the outer surface can be taken into the inner fifth and sixth insulating layers 610a and 610b of the device and back from it, using conductive vias. The metallic traces 505, 506, 507, 508, and 509 can then cross under metallic traces appearing on the surface without interference. The inner fifth and sixth insulating layers 610a and 610b therefore allow extra tracking for the PCB design to aid thermal performance, or more complex PCB designs. The device shown in FIG. 7 may therefore advantageously be used with the surface mounting components 501, 502, 503, and 504 shown in FIG. 6.

Alternatively, or in addition, the metallic traces of the fifth and sixth insulating layers 610a and 610b may be used to provide additional winding layers for the primary and secondary transformer windings. In the examples discussed above, the upper and lower windings 308 are formed on a single level. By forming the upper and lower winding layers 308 on more than one layer it is possible to put the metallic traces of one layer in an overlapping position with another layer. This means that it is more straightforward to take the metallic traces to conductive vias in the interior section of the magnetic core, and potentially more conductive vias can be incorporated into the device.

Only one of two additional insulating layers 610a or 610b may be necessary in practice. Alternatively, more than one additional insulating layer 610a or 610b may be provided on the upper or lower side of the device. The additional insulating layers 610a and 610b may be used with any of the first, second, or third preferred embodiments.

In practice, for FIGS. 4A-4C, the greater spacing of the outer conductive vias 411a, 421a from the periphery of the cavity 302 means that there is greater freedom in designing the traces and circuit board for the connected electrical components. Further, as the conductive vias 411a and 421a may have a greater cross-sectional area compared with the other vias, the conductive vias 411a and 421a may be used to reduce the overall resistance to the current flowing through the primary winding and secondary winding, thereby improving the electrical characteristics of the device.

In all of the devices described, an optional solder resist cover may be added to the exterior surfaces of the device, either the first and second isolation barriers 309a and 309b or the fifth and sixth insulating layers 610a and 610b.

Example preferred embodiments of the present invention have been described for the purposes of illustration only. These are not intended to limit the scope of protection as defined by the attached claims. Features of one preferred embodiment may be used together with features of another preferred embodiment.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. An embedded magnetic component device, comprising:
a substrate that includes a cavity with an inner wall and an outer wall;
a magnetic core located in the cavity; and
a winding that is disposed around the magnetic core and that includes inner vias that extend through the substrate; wherein
the inner vias include first inner vias, second inner vias, and third inner vias;
the first inner vias are arranged in a first inner row with a first distance from the inner wall of the cavity;
the second inner vias are arranged in a second inner row with a second distance from the inner wall of the cavity different from the first distance; and
the third inner vias are arranged in a third inner row with a third distance from the inner wall of the cavity different from the first and the second distances.

2. The embedded magnetic component device of claim 1, wherein
the winding includes outer vias that extend through the substrate;
the outer vias include first outer vias and second outer vias;

the first outer vias are arranged in a first outer row a first distance from the outer wall of the cavity; and the second outer vias are arranged in a second outer row a second distance from the outer wall of the cavity greater than the first distance.

3. The embedded magnetic component device of claim 2, wherein adjacent ones of the second outer vias are connected to inner vias in different inner rows.

4. The embedded magnetic component device of claim 2, wherein a first side and a second side of the substrate have a quadrilateral planar shape, and the second outer vias are located in a corner of the quadrilateral planar shape.

5. The embedded magnetic component device of claim 2, wherein the winding includes traces; and the traces include upper traces and lower traces.

6. The embedded magnetic component device of claim 5, wherein the upper traces connected to the first outer vias do not overlap with the upper traces connected to the second outer vias; and/or the lower traces connected to the first outer vias do not overlap with the lower traces connected to the second outer vias.

7. The embedded magnetic component device of claim 5, wherein the upper traces connected to the first outer vias are provided at a same layer as the upper traces connected to the second outer vias; and/or the lower traces connected to the first outer vias are provided at a same layer as the lower traces connected to the second outer vias.

8. The embedded magnetic component device of claim 5, wherein adjacent ones of the traces have different lengths.

9. The embedded magnetic component device of claim 5, wherein the traces include a first trace and a second trace that are adjacent to each other;

the first trace connects one of the first outer vias and one of the first inner vias; and the second trace connects one of the second outer vias and either one of the second inner vias or one of the third inner vias.

10. The embedded magnetic component device of claim 2, wherein the second outer vias have a greater cross-sectional area than the first outer vias.

* * * * *